United States Patent
Vanukuru

(10) Patent No.: US 10,784,243 B2
(45) Date of Patent: Sep. 22, 2020

(54) UNIPLANAR (SINGLE LAYER) PASSIVE CIRCUITRY

(71) Applicant: GLOBALFOUNDRIES INC., Grand Cayman (KY)

(72) Inventor: Venkata Narayana Rao Vanukuru, Bangalore (IN)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/997,277

(22) Filed: Jun. 4, 2018

(65) Prior Publication Data
US 2019/0371776 A1    Dec. 5, 2019

(51) Int. Cl.
| | |
|---|---|
| *H01L 25/18* | (2006.01) |
| *H01L 27/01* | (2006.01) |
| *H01L 23/00* | (2006.01) |
| H01L 27/092 | (2006.01) |

(52) U.S. Cl.
CPC ............. *H01L 25/18* (2013.01); *H01L 24/02* (2013.01); *H01L 27/016* (2013.01); *H01L 27/092* (2013.01); *H01L 2224/0233* (2013.01); *H01L 2224/02313* (2013.01)

(58) Field of Classification Search
CPC ....... H01L 25/18; H01L 27/016; H01L 24/02; H01L 2224/02313; H01L 2224/0233; H01L 27/092
See application file for complete search history.

(56) References Cited

U.S. PATENT DOCUMENTS

| | | | |
|---|---|---|---|
| 5,915,188 A | 6/1999 | Ramakrishnan et al. | |
| 6,329,715 B1* | 12/2001 | Hayashi | H01L 23/15 |
| | | | 257/528 |
| 6,346,741 B1 | 2/2002 | Van Buskirk et al. | |
| 8,853,819 B2 | 10/2014 | Chen et al. | |
| 9,966,182 B2 | 5/2018 | Stamper et al. | |
| 2003/0137457 A1 | 7/2003 | McKinzie, III et al. | |
| 2004/0081811 A1 | 4/2004 | Casper et al. | |
| 2007/0065964 A1 | 3/2007 | Degani | |
| 2009/0170242 A1 | 7/2009 | Lin et al. | |
| 2012/0305984 A1* | 12/2012 | Campi, Jr. | H01L 29/742 |
| | | | 257/124 |
| 2017/0213637 A1 | 7/2017 | Vanukuru | |

OTHER PUBLICATIONS

Hettak et al., "A Class of Novel Uniplanar Series Resonators and Their Implementation in Original Applications", IEEE Transactions on Microwave Theory and Techniques, vol. 46, No. 9, Sep. 1998, 7 pages.

(Continued)

*Primary Examiner* — Thanh T Nguyen
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to uniplanar (e.g., single layer) passive circuitry and methods of manufacture. The structure includes: passive circuitry comprising plural components each of which are formed on a same wiring level; and interconnects on the same wiring level connecting the plural components of the passive circuitry.

20 Claims, 9 Drawing Sheets

(56) References Cited

OTHER PUBLICATIONS

Durand et al., "High performance RF inductors integrated in advanced Fan-Out wafer level packaging technology" IEEE, Mar. 1, 2012, abstract.

Dehlink et al., "Integrated Bandpass Filter at 77 GHz in SiGe Technology", IEEE Microwave and Wireless Components Letters, vol. 17, No. 5, May 2007, 3 pages.

Liang, "Design of a Q-Band Eight-Way Lumped Power Divider in 90 nm CMOS Technology", IEEE Microwave and Wireless Components Letters, vol. 24, No. 3, Mar. 2014, 3 pages.

Durand et al., "High performance RF inductors integrated in advanced Fan-Out wafer level packaging technology" IEEE, Mar. 1, 2012, 4 pages.

Reynaert et al., "Power Combining Techniques for RF and mm-wave CMOS Power Amplifiers", IEEE, 2007, 4 pages.

Taiwanese Office Action and Search Report in TW Application No. 108115265 dated Jan. 22, 2020, 9 pages.

\* cited by examiner

UNIPLANAR (SINGLE LAYER) PASSIVE CIRCUITRY

FIELD OF THE DISCLOSURE

The present disclosure relates to semiconductor structures and, more particularly, to uniplanar (e.g., single layer) lumped passive circuitry and methods of manufacture.

BACKGROUND

Passive circuitry includes important components for the functioning of a semiconductor device. The passive circuitry can include devices like inductors, resistors, capacitors, conductors and transformers, as examples. The inductor suppresses a rapid change of a current by inducing voltage in proportion to an amount of a current change. A ratio of counter electromotive force generated due to electromagnetic induction according to the change of the current flowing in a circuit is called an inductance (L). A resistor is a device having a resistance to the passage of an electric current. On the other hand, a capacitor is a device used to store an electric charge, consisting of one or more pairs of conductors separated by an insulator. A power combiner couples a defined amount of the electromagnetic power from several ports to a single port thereby enhancing the power level of signals. A transformer is a static electrical device that transfers electrical energy between two or more circuits through electromagnetic induction.

The fabrication of the components of the passive circuitry in semiconductor devices consists of lithography, etching and deposition processes on multiple wiring levels. To connect the separate components and their constituent elements fabricated on different wiring levels, via interconnects need to be fabricated through multiple wiring levels. The via interconnect structures will provide electrical connection of the individual constituent parts of the components from one level to another level.

By way of example, in manufacturing an inductor, a first winding is formed on a first wiring level and a second winding (or underpass connection) is formed on a second wiring level. A via interconnect is then fabricated in an intermediate wiring level to connect the first and second windings formed on different wiring levels. Similar processes are also required for other components of the passive circuitry and the connection of each component to one another, e.g., a resistor on a first wiring level and components of a capacitor formed on a second and third wiring level. These processes become very complex and result in significant process cost and variability. In addition, the components and their constituent parts on different wiring levels use significant amount of area on the semiconductor chip, which is at a premium particularly as technology nodes continue to scale downwards.

SUMMARY

In an aspect of the disclosure, a structure comprises: passive circuitry comprising plural components each of which are formed on a single wiring level; and interconnects on the same wiring level connecting the plural components of the passive circuitry.

In an aspect of the disclosure, a structure comprises: a first passive component and its constituent structures composed of a metal wiring and formed exclusively in a single wiring level; a second passive component and its constituent structures composed of a metal wiring and formed exclusively in the single wiring level; and a metal interconnect structure exclusively in the single wiring level and connecting the first passive component to the second passive component thereby forming passive circuitry in the single wiring level.

In an aspect of the disclosure, a method of manufacturing passive circuitry comprises: forming a first passive component and its constituent structures composed of a metal wiring and formed exclusively in a single wiring level; forming a second passive component and its constituent structures composed of a metal wiring and formed exclusively in the single wiring level; and forming a metal interconnect structure exclusively in the single wiring level and connecting the first passive component to the second passive component thereby forming passive circuitry in the single wiring level.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
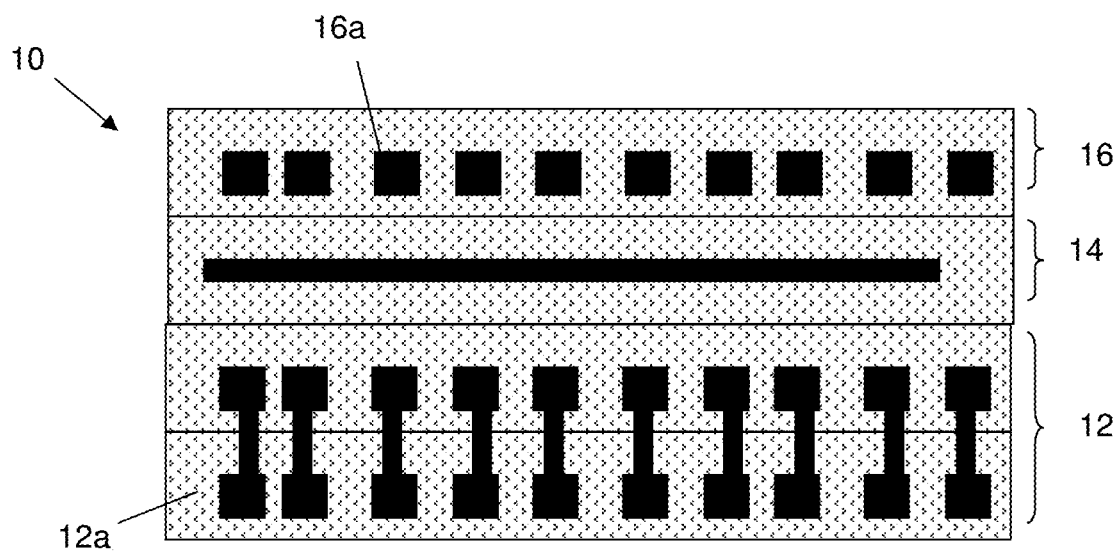
FIG. 1 shows a schematic diagram of passive device/circuitry on a single metal layer.

The present disclosure relates to semiconductor structures and, more particularly, to lumped uniplanar (e.g., single wiring level) passive circuitry and methods of manufacture. More specifically, the present disclosure relates to uniplanar (e.g., single layer) passive circuitry such as, e.g., any combination of resistors, capacitors, inductors, and transformers. Advantageously, by implementing the structures and methods described herein, CMOS processes and related processing complexities (e.g., process variabilities) are significantly reduced compared to conventional passive circuitry provided on multiple wiring levels of a semiconductor chip. Also, the passive circuitry can achieve higher performance requirements in many different technologies, e.g., millimeter wave applications and control circuitry implemented using SiGe or SOI technologies. For example, the passive circuitry can be provided in the redistribution layer and active circuitry can be provided in SiGe/SOI layers of the chip thereby reducing cost and complexity while achieving higher performance.

In embodiments, the passive circuitry such as, e.g., resistors, capacitors, inductors, transformers and power combiners, is provided on a single wiring level of the semiconductor chip, devoid or free of any need for via interconnect structures for connection of any individual component or components. In embodiments, the passive circuitry can be provided in a redistribution layer or a back end of the line layer of the semiconductor chip, as examples. The passive circuitry can be manufactured by a pattern transfer (e.g., a single patterning process and single etching process) onto a copper sheet. The patterned copper sheet may be a discrete part that may be mounted on a CMOS chip.

The passive circuitry can be implemented with many different components with different shapes on the single wiring level. By way of non-limiting example, the following components and connections to one another can be implemented in a single wiring level:

(i) inductors can be circular, horse-shoe shaped and of meandering lines (multiple turns and segments);

(ii) capacitors can be inter-digitated metal on metal capacitors on a single wiring level;

(iii) coupled inductors can be formed into a loop or hair-pin to form transformers; and (iv) resistors can be formed in a bar or serpentine shape.

Moreover, in implementation, the inductors and transformers can be implemented in the redistribution layer with the use of magnetic materials for reduced size. Also, the capacitors can be implemented, e.g., in the redistribution layer, with high-k dielectrics to form a smaller footprint. In further embodiments, any of the passive circuitry can be provided in the redistribution layer and active circuit can be provided in SiGe/SOI layers of the chip.

By having the passive circuitry on a single wiring level, there is only the need for a single lithography, etching and deposition process, which saves significant cost and reduces process variability compared to conventional circuit processes. In addition, by implementing the passive circuitry on a single layer it is possible to provide selective high-μ and high-k materials for the inductor and capacitor, respectively, to increase device performance. Moreover, significant real estate on the chip is saved by implementing the passive circuitry on a single layer, e.g., the circuits are more compact than conventional circuits on multiple wiring levels.

The passive circuitry of the present disclosure can be manufactured in a number of ways using a number of different tools. In general, though, the methodologies and tools are used to form structures with dimensions in the micrometer and nanometer scale. The methodologies, i.e., technologies, employed to manufacture the passive circuitry of the present disclosure have been adopted from integrated circuit (IC) technology. For example, the structures are built on wafers and are realized in films of material patterned by photolithographic processes on the top of a wafer. In particular, the fabrication of the passive circuitry uses three basic building blocks: (i) deposition of thin films of material on a substrate, (ii) applying a patterned mask on top of the films by photolithographic imaging, and (iii) etching the films selectively to the mask.

FIG. 1 shows a schematic of passive circuit on a single layer, amongst other features, and respective fabrication processes in accordance with aspects of the present disclosure. More specifically, the structure 10 of FIG. 1 includes back end of line (BEOL) components represented by reference numeral 12. The back end of line components can be interconnects, wiring levels, etc., provided on multiple metal layers in insulator material 12a. In embodiments, the insulator material 12a can be an oxide material. An optional magnetic layer 14 is provided between the back end of line components 12 and a redistribution layer 16. In embodiments, the magnetic layer 14 can be used to reduce the inductor size.

The redistribution layer 16 is representative of a single wiring layer which can include any of the combination of the components of the passive circuitry described herein. For example, the metal material 16a of the redistribution layer 16 can be representative of any combination of, e.g., resistors, capacitors, inductors, transformers and power combiners, manufactured in a single wiring layer using a single lithography, etching and metal deposition process. The single process described herein will also include associated interconnections on the single wiring layer to connect the different components and form the passive circuitry. Accordingly and advantageously, by having the passive circuitry 16a in a single wiring level, there is no need for via interconnect structures to connect components formed on different metal layers.

The patterning process can be utilized to provide any desired shape of the components on a single wiring level (e.g., redistribution layer), which encompass the passive circuitry as described herein. The passive circuitry can be manufactured by a pattern transfer (e.g., a single patterning process and single etching process) onto a copper sheet, with the copper sheet being a discrete part that may be mounted on a CMOS chip.

Alternatively, and by way of example, the metallization structure, e.g., passive circuitry 16a, can be formed by a resist formed over the insulator material 16 being exposed to energy (light) to form a pattern (opening) of any desired shape. An etching process with a selective chemistry, e.g., reactive ion etching (RIE), will be used to form, in a single wiring level, one or more trenches in the insulator material 16 through the openings of the resist. The resist can then be removed by a conventional oxygen ashing process or other known stripants. Following the resist removal, conductive material can be deposited by any conventional deposition processes, e.g., chemical vapor deposition (CVD) processes, within the trenches to form the components and interconnects of the passive circuitry. Accordingly, the conductive material will be deposited on a single metal layer, free of any via interconnect structures. Any residual material on the surface of the insulator material 16 can be removed by conventional chemical mechanical polishing (CMP) processes.

In this way, the entire passive circuitry, e.g., any combination of the resistors, capacitors, inductors, transformers and power combiners, can be connected together without the need for additional via interconnect structures. Also, as the manufacturing complexity is greatly reduced, there will be less process variability for each of the different passive components resulting in robust circuit characteristics (compared to conventional device). Moreover, by implementing an additional lithography, etching and deposition method, it is also possible to easily introduce other materials to the passive circuitry to enhance its performance. For example, the insulator material 16 about the inductor and capacitor can be removed and replaced with selective high-μ and high-k materials, respectively, to increase device performance.

Figure 2A:
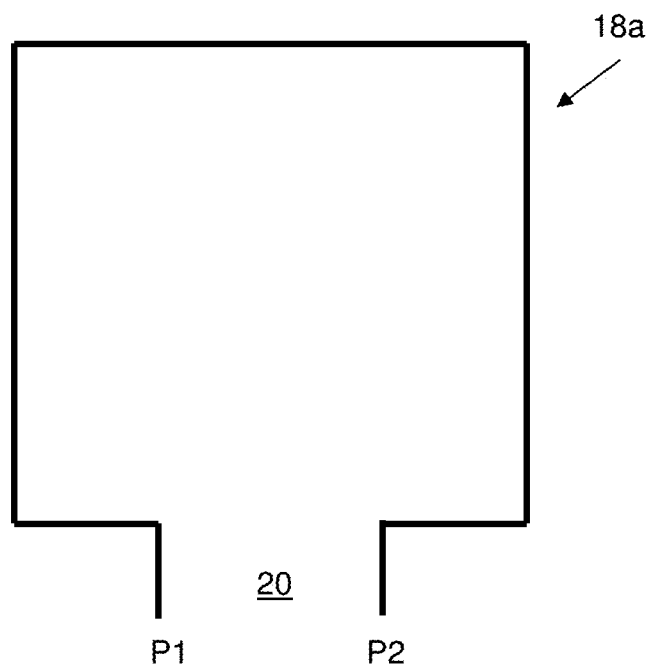
FIGS. 2A-2C show different inductor or resistor configurations (patterns) realized on a single redistribution layer in accordance with aspects of the present disclosure.
Figure 2B:
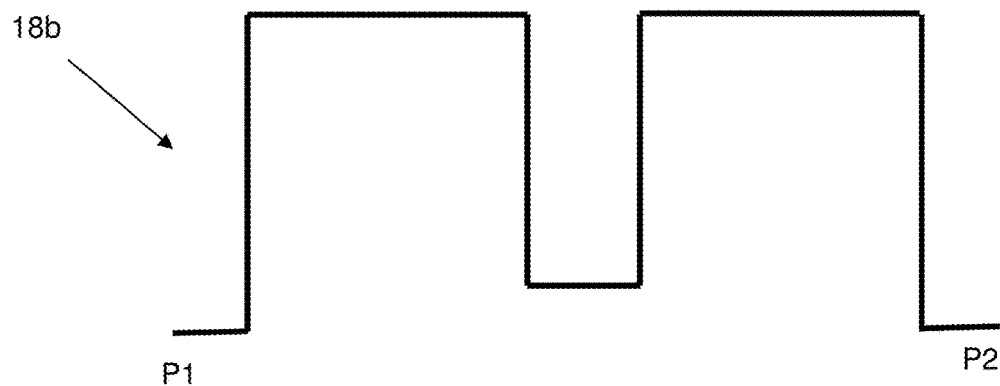
Figure 2C:
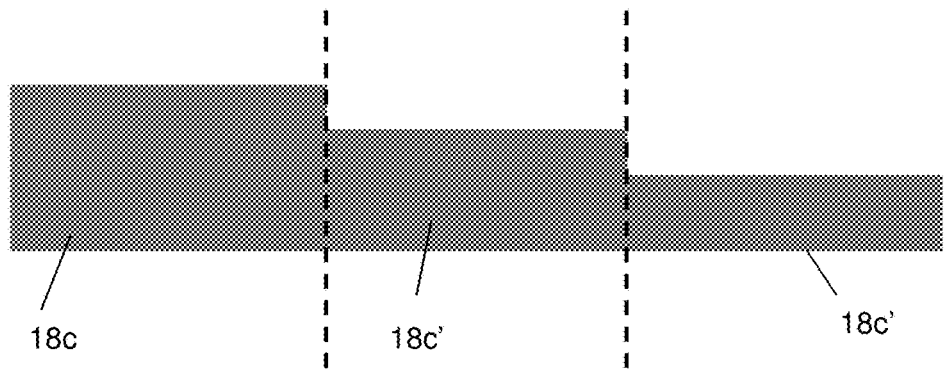

FIGS. 2A-2C show different inductor or resistor configurations (patterns) in accordance with aspects of the present disclosure. For example, the inductor (or resistor) 18a shown in FIG. 2A can be a ring inductor (e.g., horseshoe shaped); whereas, the inductor (or resistor) 18b in FIG. 2B is a meandering line (e.g., multiple turns/segments). FIG. 2C shows that the inductors 18c, 18c', 18c" can have different thicknesses tailored for different performances. The inductors 18c, 18c', 18c" of FIG. 3 can be implemented in many different shapes such as that shown in FIGS. 2A and 2B.

More specifically, the inductor (or resistor) 18a of FIG. 2A includes metal lines provided on a single metal layer formed into a ring shape with an opening 20 between the ports P1, P2. In the inductor (or resistor) 18b of FIG. 2B, the metal lines are patterned in a stepped sinusoidal pattern, with ports P1, P2 at each respective end. In embodiments, spacing between each consecutive segment within the meandered inductor/resistor 18b may be increased at a constant rate or any other monotonic rate (including periodically constant) moving from one port P1 to the other port P2. The thickness of the meandering turns can be varied depending on the frequency band, with higher thickness for low frequency bands and lower thickness for high frequency bands. Several other shapes for the inductors (or resistors) are also contemplated herein, e.g., circular loop, fractals along with meandered line.

Figure 3:
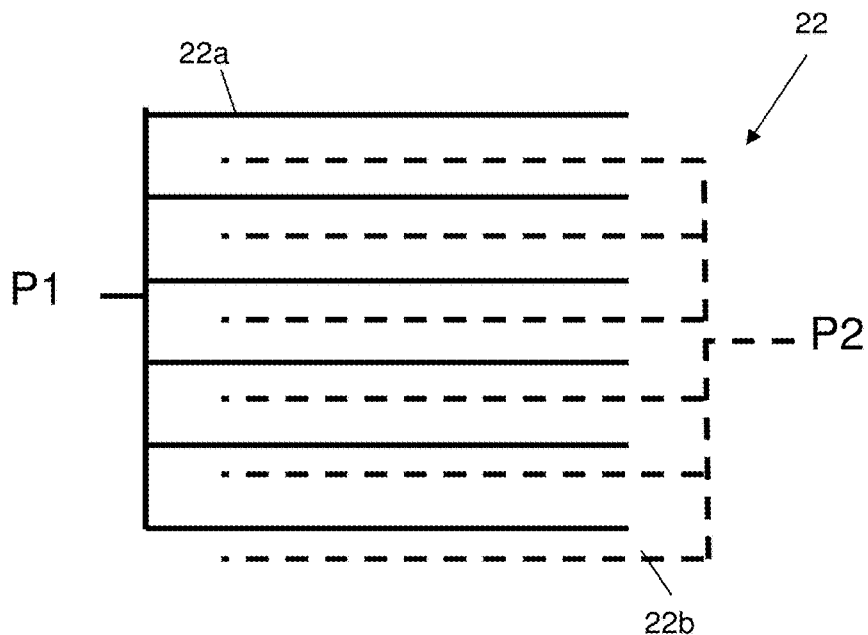
FIG. 3 shows a capacitor configuration (pattern) in accordance with aspects of the present disclosure.

The inductors 18c, 18c', 18c" shown in FIG. 3 can be a single inductor or multiple inductors. In any of the different scenarios, the inductors 18c, 18c', 18c" or segments thereof can be of different thicknesses which are tailored for different frequencies. In embodiments, the thicker inductor 18c will be used for a lowest frequency, freq 1, the thinnest inductor 18c" will be used for the highest frequency, freq 3, and the middle thickness inductor will be used for a middle frequency, freq 2, where freq 1<freq 2<freq 3. By way of example, the freq 3 can be 5 GHz and freq 1 can be 1 GHZ, with freq 2 being anything between 5 GHz and 1 GHz. In this way, the inductors can be tailored for different frequencies. In addition, a spacing of each consecutive segment of the meandering turns can be increased at a constant rate or other monotonic rate with a narrower spacing for low frequency bands and higher spacing for higher frequency bands.

Still referring to FIGS. 2A-2C, the inductors 18a-18c" (or transformer fabricated from multiple inductors) can be embedded within either insulator material or high-μ material for increased density. In the case of high-μ material, this material can be selectively deposited around the inductor (or transformer) windings in the same wiring level. The high-μ material can be, e.g., a ferromagnetic alloy with very high permeability used for enhancing the inductance density while shielding sensitive electronic equipment against static or low-frequency magnetic fields. The high-μ material can be iron nickel alloys and, more specifically, approximately 77% nickel, 16% iron, 5% copper, and 2% chromium or molybdenum. As another example, the high-μ material can be composed of approximately 80% nickel, 5% molybdenum, small amounts of various other elements such as silicon, and the remaining 12 to 15% iron.

FIG. 3 shows a capacitor configuration (pattern) in accordance with aspects of the present disclosure. In FIG. 3, the capacitor 22 can be a metal insulator metal capacitor with interleaved fingers 22a, 22b (e.g., interleaved comb structures) on a single wiring level. In embodiments, the interleaved fingers 22a, 22b are representative of a first capacitor plate and a second capacitor plate, respectively, with insulator material separating the two capacitor plates. The width and spacing between the interleaved fingers 22a, 22b can be varied for improved performance at different frequency bands. In addition, the capacitor 22 can be surrounded by high-k dielectric material for improved performance. The high-k dielectric material is provided on the same wiring level and can be any high-k dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

Figure 4A:
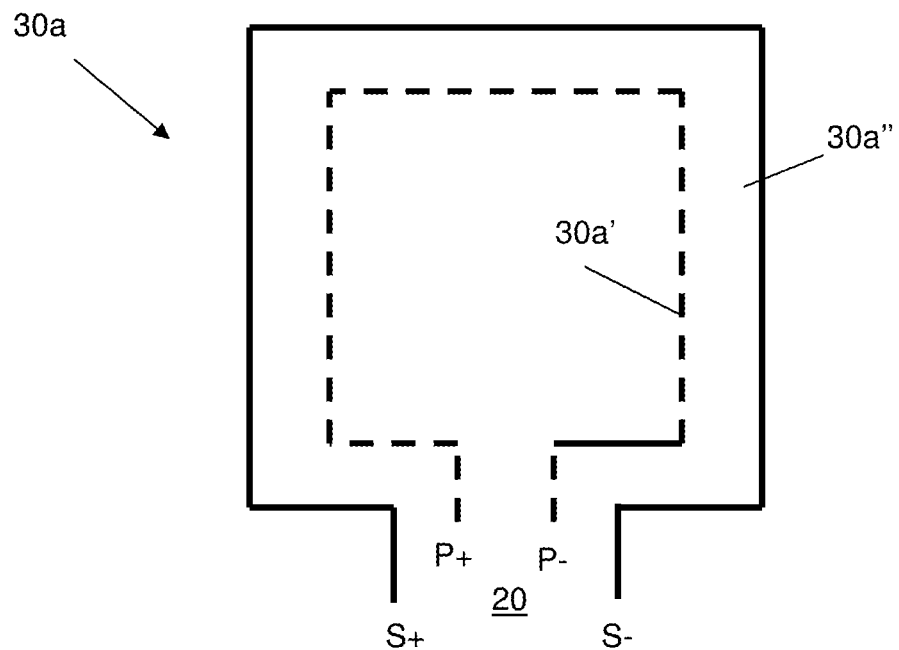
FIGS. 4A and 4B show different transformer configurations (patterns) in accordance with aspects of the present disclosure.
Figure 4B:
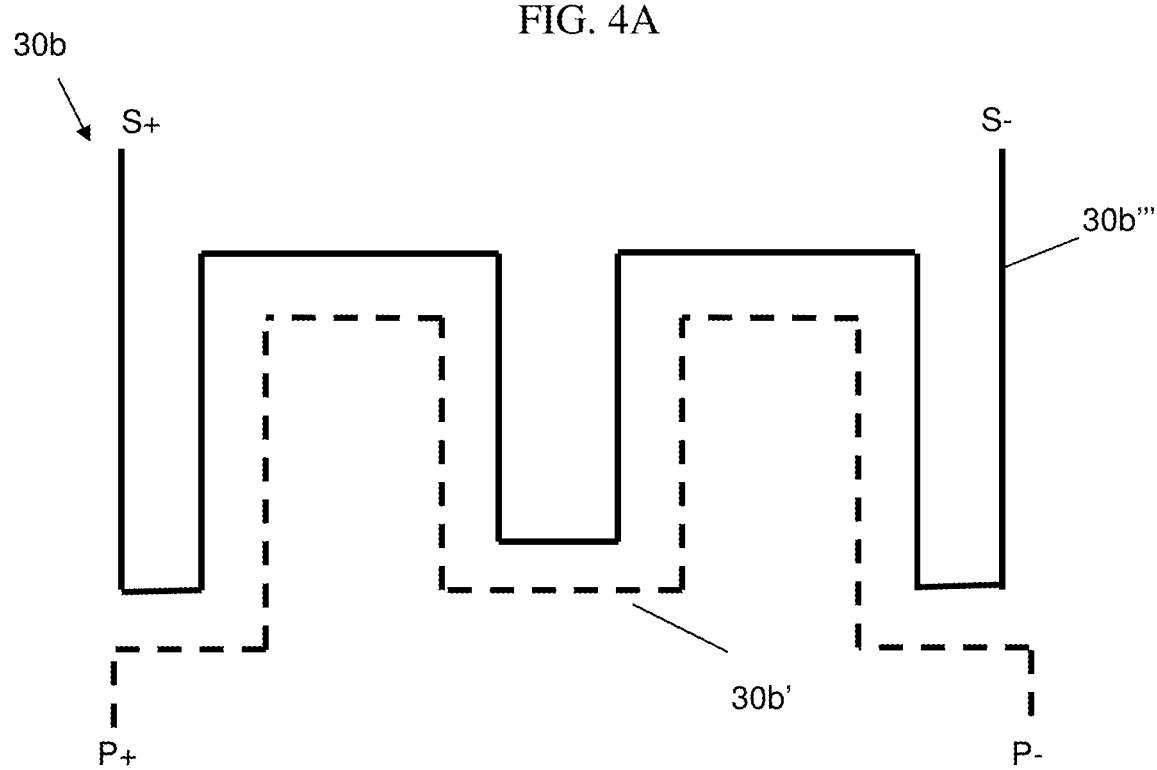

FIGS. 4A and 4B show different transformer configurations (patterns) in accordance with aspects of the present disclosure. More specifically, the transformer 30a shown in FIG. 4A is a loop transformer; whereas, the transformer 30b shown in FIG. 4B is a meandering transformer. The loop transformer 30a includes two separate metal lines (e.g., primary inductor 30a' and secondary inductor 30a") formed in a single metal layer in a ring shape with an opening 20 between the ports P+, P−, S+, S−. In FIG. 4A, the ports P+, P−, S+, S− are each on the same side. Also, in embodiments, the transformers 30a, 30b can be embedded within either insulator material or high-μ material for increased density as already described herein. It should also be understood by those of skill in the art that several other shapes for the transformer are contemplated herein, e.g., circular loop, along with meandered line.

Referring to FIG. 4B, the meandering transformer 30b includes two metal lines (e.g., primary inductor 30b' and secondary inductor 30b") each of which are patterned in a stepped sinusoidal pattern in a single metal layer, with ports P+, P− on an opposite side of the ports S+, S−. In this embodiment, the meandering transformer 30b includes spacing between each consecutive segment which may be increased at a constant rate or any other monotonic rate (including periodically constant) moving from one port P1 to the other port P2.

Figure 5A:
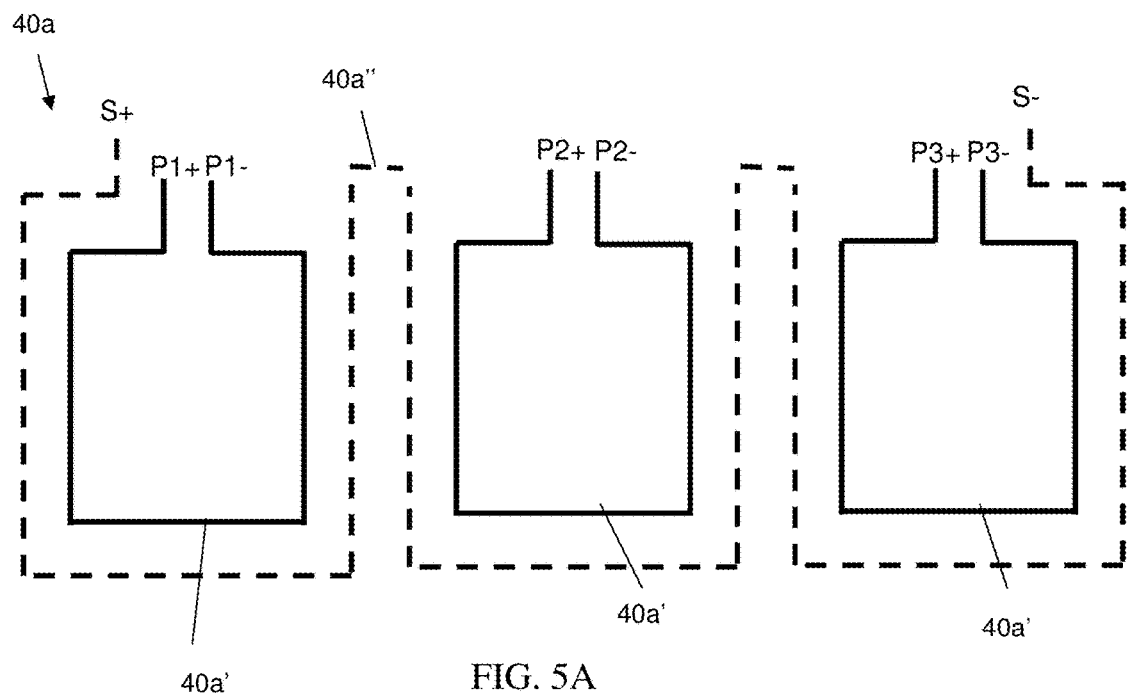
FIGS. 5A and 5B show different power combiner configurations (patterns) in accordance with aspects of the present disclosure.
Figure 5B:
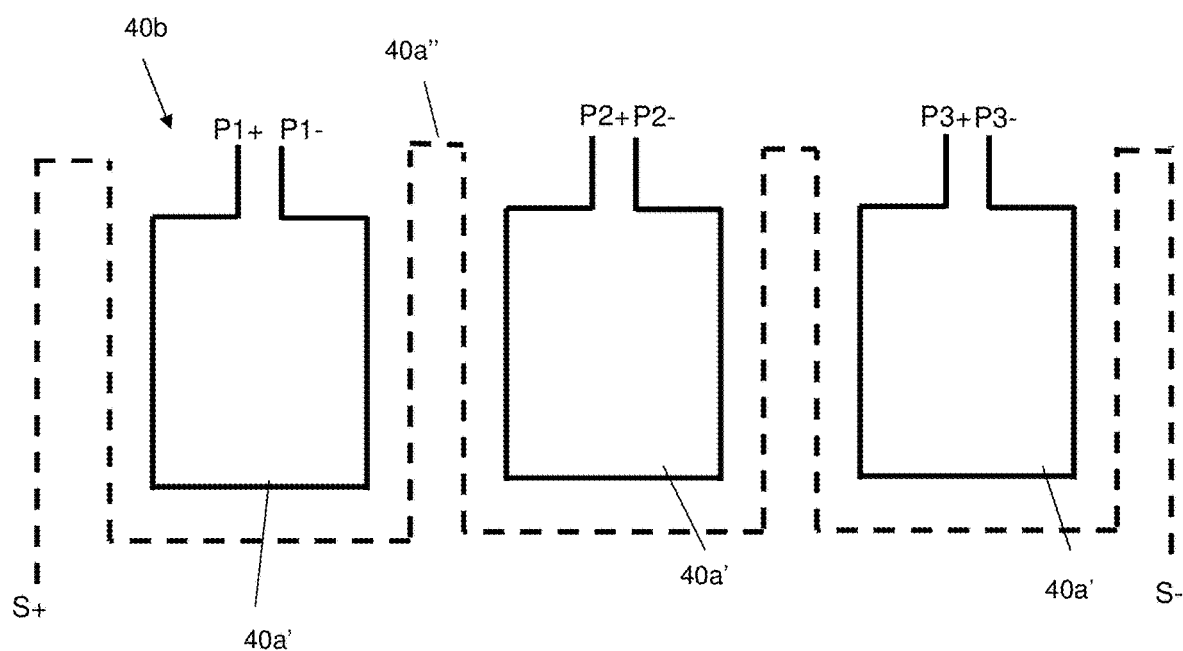

FIGS. 5A and 5B show different power combiner configurations (patterns) in accordance with aspects of the present disclosure. More specifically, the power combiners 40a shown in FIGS. 5A and 5B each comprise multiple ring inductors 40a' and a meandering transformer 40a". As shown in each of these configurations, the each ring inductors 40a' is provided in a section of the meandering transformer 40a". In FIG. 5A, the ports P+, P−, S+, S− are each on the same side; whereas, in FIG. 5B, the ports P+, P− are on an opposite side of the ports S+, S−. It should also be recognized that the thicknesses of the different power combiner configurations can vary along its length, e.g., portions have a selectively thicker and thinner portion. More specifically, the meandering transformer 40a" can include varying thickness based on the voltage inputs into the multiple ring inductors 40a'. For example, thicker portions can be used to handle higher currents (voltages) and for electro-migration issues occurring at higher currents (voltages).

Figure 6A:
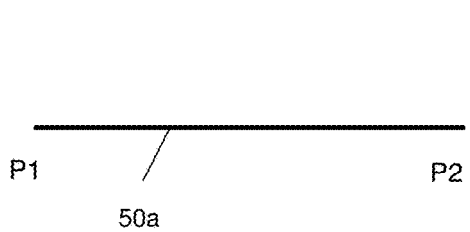
FIGS. 6A-6C show different configurations of a resistor in accordance with aspects of the present disclosure.
Figure 6B:
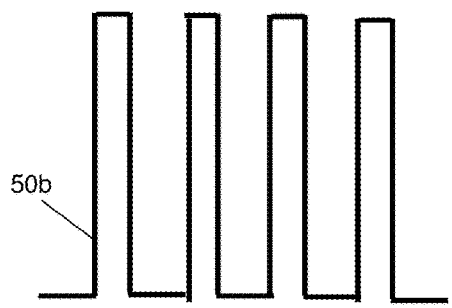
Figure 6C:

FIGS. 6A-6C show different configurations of a resistor in accordance with aspects of the present disclosure. More specifically, FIG. 6A shows a bar resistor 50a, and FIG. 6B shows a serpentine (stepped sinusoidal shape) resistor 50b. FIG. 6C shows a slotted resistor 50c. Although two slots 50c' are shown in FIG. 6C, it should be recognized that any number of slots 50c can be provided to reduce or increase the overall resistance of the resistor 50c. In addition, the slots 50c' can have different widths to reduce or increase the overall resistance of the resistor 50*c*. For example, a wider slot or more slots will increase the overall resistance of the resistor 50*c* due to less metal present in the resistor, itself. Similarly, the resistance of the bar resistor 50*a* or serpentine shape resistor 50*b* can be increased or decreased by decreasing or increasing the thickness of the bar resistor 50*a*, or serpentine shape resistor 50*b*, respectively.

In further embodiments, any of the resistors 50*a*, 50*b*, 50*c* shown in FIGS. 6A-6C can be subjected to a high energy implant to increase its resistivity. For example, the resistors 50*a*, 50*b*, 50*c* can be subjected to a high energy (e.g. 4-10 KeV) He ion beam, which will damage the crystal lattice resulting in an increased scattering and reduced mobility and conductivity (and hence a higher restivity).

Figure 7A:
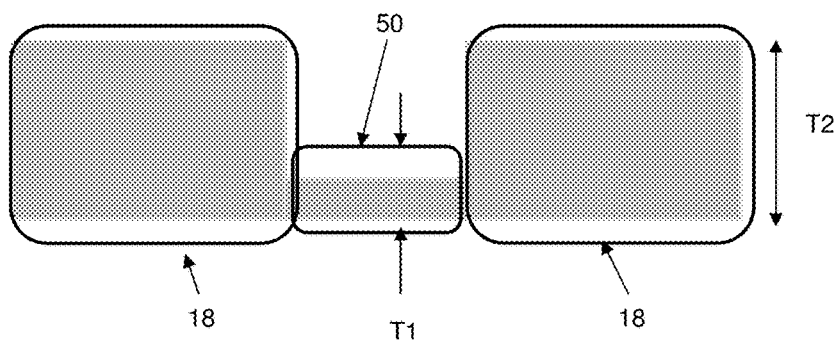
FIG. 7A shows a passive circuit comprising a resistor and inductor in accordance with aspects of the present disclosure.

FIG. 7A shows a combination of a passive circuit comprising a resistor 50 and inductor 18, in accordance with aspects of the disclosure. In embodiments, the resistor 50 and inductor 18 are formed on a single wiring layer, e.g., redistribution layer, without the need for via interconnects. The resistor 50 and inductor 18 can also be of different thicknesses, with the resistor 50 have a thickness, T1, less than the thickness, T2, of the inductor 18, e.g., T1<T2. As should be understood by those of skill in the art, the reduction in thickness of the resistor 50 will result in a narrow width (e.g., less metal) and hence an increase in resistance. The resistor 50 can also be subjected to subjected to a high energy (e.g. 4-10 KeV) He ion beam, which will damage the crystal lattice resulting in an increased scattering and reduced mobility and conductivity (and hence a higher restivity). In embodiments, the resistor 50 and inductor 18 can be formed by either a subtractive or additive process as should be understood by those of skill in the art such that no further explanation is required herein.

Figure 7B:
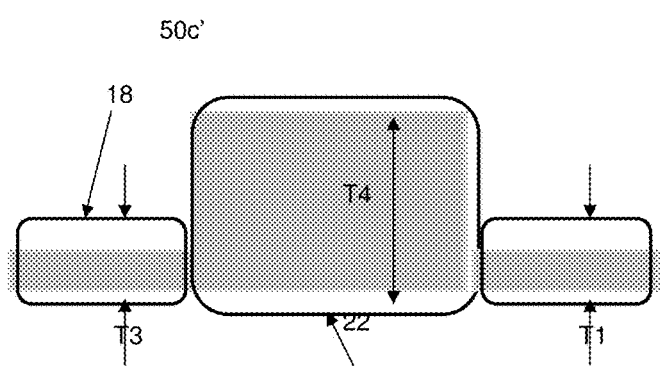
FIG. 7B shows a passive circuit comprising a capacitor and inductor in accordance with aspects of the present disclosure.

FIG. 7B shows a combination of a passive circuit comprising an inductor 18 and capacitor 22, in accordance with aspects of the disclosure. In embodiments, the inductor 18 and capacitor 22 are formed on a single wiring layer, e.g., redistribution layer, without the need for via interconnects. The inductor 18 and capacitor 22 can also be of different thicknesses, with the inductor 18 have a thickness, T3, less than the capacitor 22 thickness, T4, of the, e.g., T3<T4. As should be understood by those of skill in the art, the increase in thickness of the capacitor 22 will result in a more metal and, hence, an increase in capacitance. In embodiments, the capacitor 22 and inductor 18 can be formed by either a subtractive or additive process as should be understood by those of skill in the art such that no further explanation is required herein for a complete understanding of the present structures.

Figure 8:
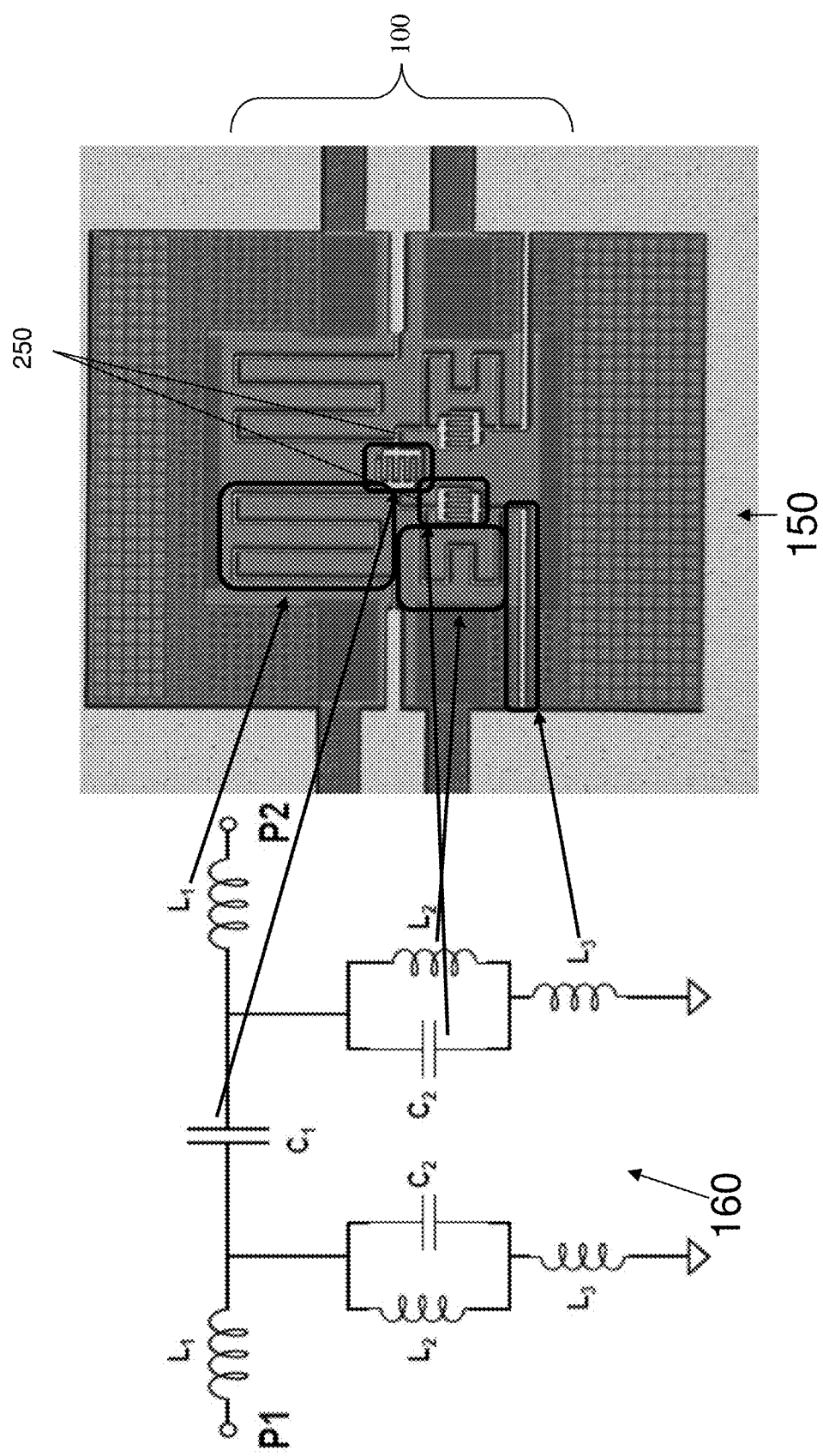
FIG. 8 shows a schematic diagram and chip image of passive circuitry on a single wiring level in accordance with aspects of the present disclosure.

FIG. 8 shows both a schematic diagram 150 and chip image of passive circuitry 160 on a single wiring level in accordance with aspects of the present disclosure. More specifically, FIG. 8 shows plural inductors $L_1$, $L_2$, $L_3$ and plural capacitors $C_1$, $C_2$ connected together in a single wiring level on the chip image to form a passive circuitry 100 (without the need for any via interconnect structures). In this configuration, the inductors $L_1$, $L_2$, $L_3$ are represented as meandering lines and the capacitors $C_1$, $C_2$ are interdigital metal-insulator-metal capacitors (e.g., comb structure with interleaved fingers), each of which are connected together by interconnects 250 on the same wiring level (hence being devoid of via interconnects to form the passive circuitry).

As thus shown, by implementing the structures and processes described herein, different components, e.g., inductors, capacitors, resistors, etc., can be embedded and connected together within a single wiring level for reduced overall size. These different components can form passive circuitry in the redistribution layer or other device layers (including one or more of the back end of line layers). Moreover, a single chip can include several different wiring levels, with any combination of the single wiring levels including the passive circuitry as described herein. Also, the passive circuit can be provided in the redistribution layer and any active circuitry can be provided in SiGe/SOI layers of the chip.

Figure 9:
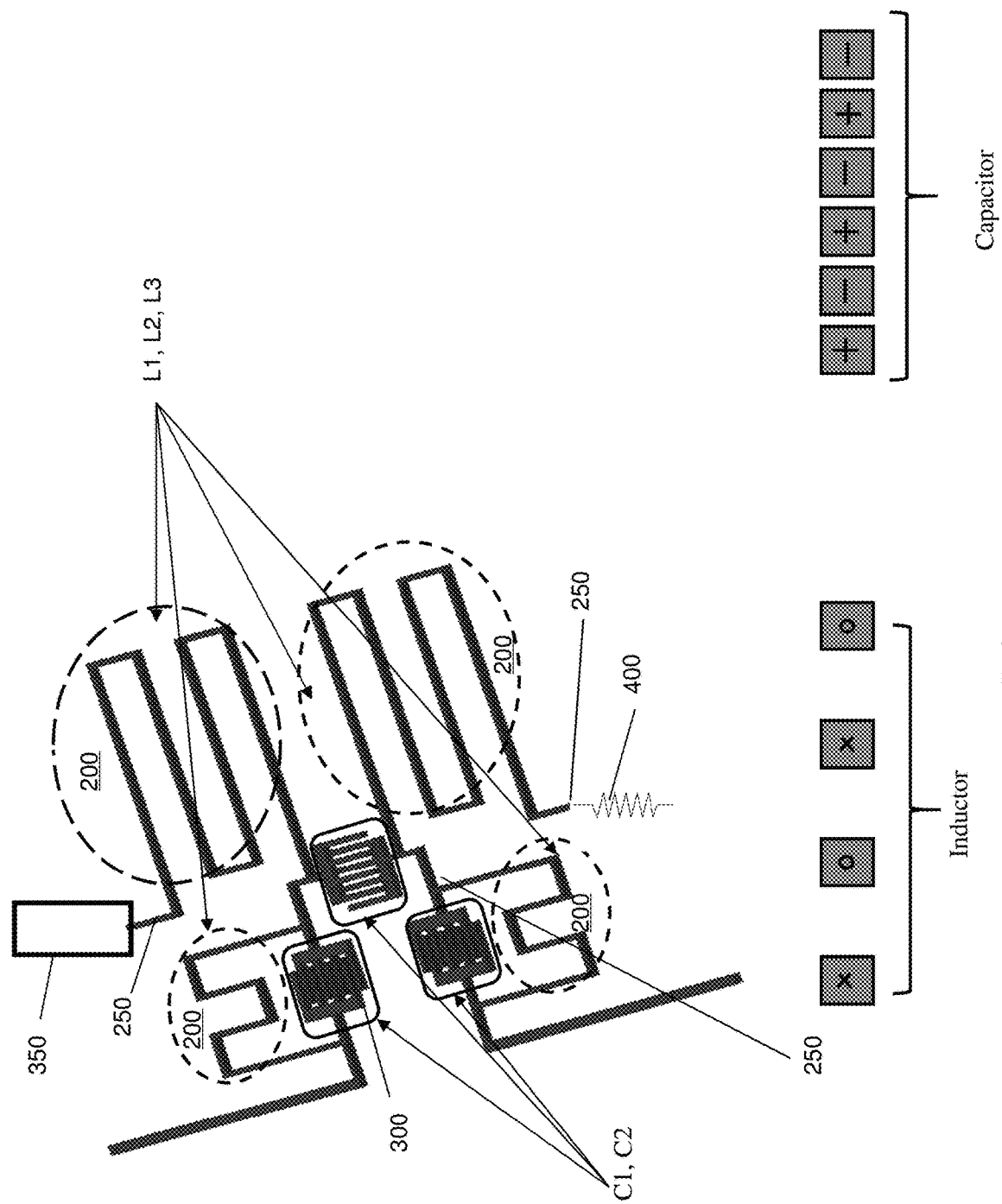
FIG. 9 shows an exploded view of the passive circuitry on a single wiring level in accordance with aspects of the present disclosure.

FIG. 9 shows a three dimensional view of a passive circuitry on a single wiring level in accordance with aspects of the present disclosure. In this representation, the plural inductors $L_1$, $L_2$, $L_3$ are shown to be of various sizes, embedded in a selectively placed high-μ material 200. In addition, the plural capacitors $C_1$, $C_2$ are interdigital metal-insulator-metal capacitors (e.g., comb structure with interleaved fingers) of various sizes connected to the plural inductors $L_1$, $L_2$, $L_3$ by interconnects 250 on a same wiring level. The capacitors $C_1$, $C_2$ are shown to be embedded in a selectively placed high-k material 300.

And, as shown also in the representation of FIG. 9, by implementing the structures shown herein, it is now possible to form in a single wiring level a first plate of the capacitors $C_1$, $C_2$ with multiple fingers, a portion of the same wiring level forming the second plate of the capacitors $C_1$, $C_2$ with multiple fingers and a first metal interconnect 250 using the same wiring level to connect to a last winding/segments of one of the plural inductors $L_1$, $L_2$, $L_3$ also on the same wiring level. A metal interconnect 250 using the same wiring level can also connect to a primary wiring of a transformer 350 with one or more turns/segments, with a portion of the same wiring level forming the secondary wiring of the transformer 350 with one or more turns/segments. In addition or alternatively, a metal interconnect 250 using the same wiring level can connect to segments (first and last segments) of a resistor 400 using the same wiring level, etc.

Figure 10:
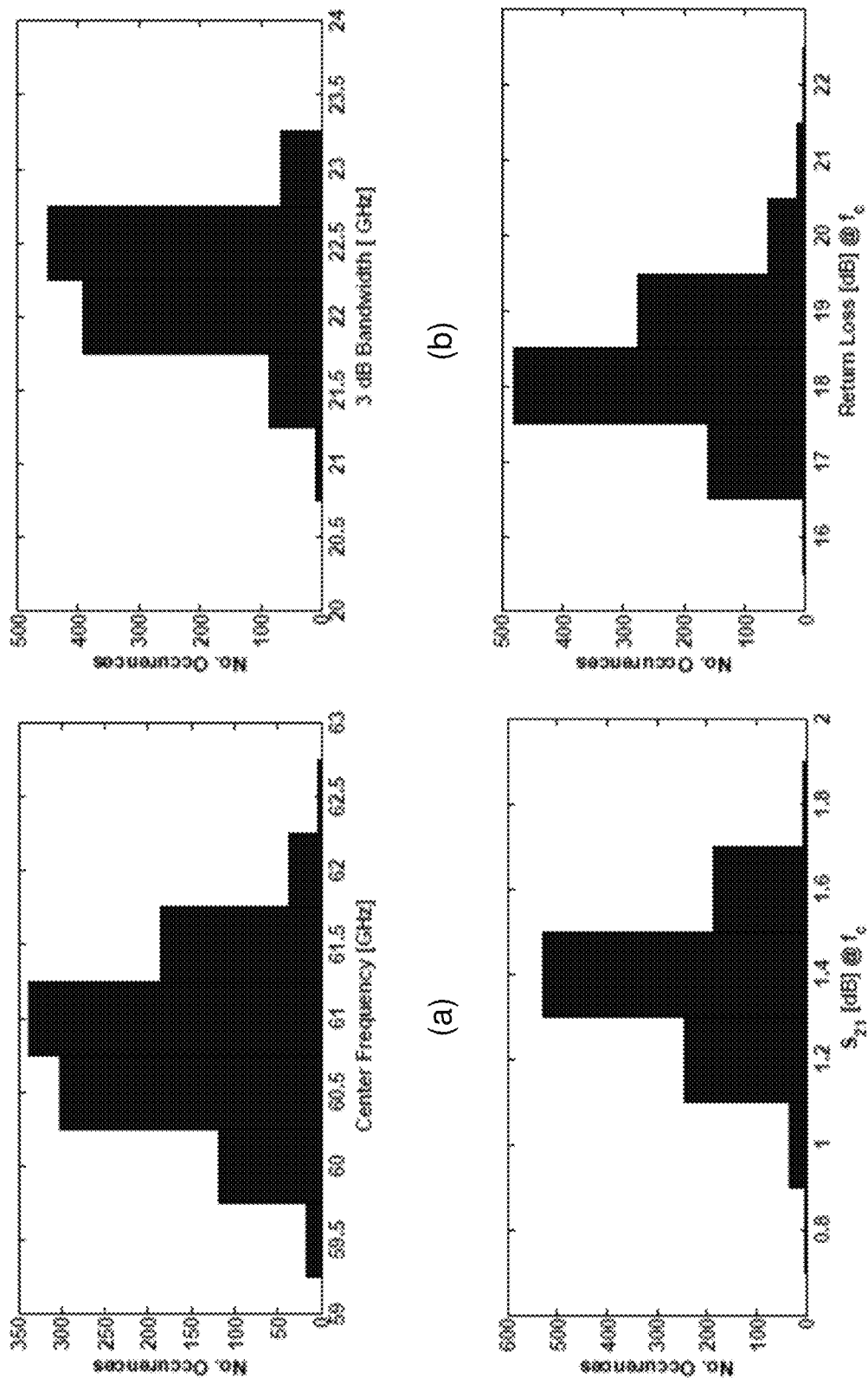
FIG. 10 shows simulations of process variability of the manufacturing processes of the passive circuitry on a single wiring level in accordance with aspects of the present disclosure.

FIG. 10 shows simulated results illustrating the impact of variability of the manufacturing processes on the passive circuitry implemented using a single wiring level in accordance with aspects of the present disclosure. In particular, the graphs of FIG. 10 show that the process variability for the manufacturing of the passive circuitry are well centered, e.g., minimal process variability. Graph (a) shows a frequency predominately centered at about 61 GHz. Graph (b) shows a 3 dB bandwidth predominately centered at about 22.5 GHz. Graph (c) shows an insertion loss predominately centered at about 1.4 dB; whereas, graph (d) shows a return loss predominately centered at about 18 dB. Accordingly, the filter is shown to have significantly less process variability and will, hence, be more robust (compared to conventional circuitry provided on multiple levels).

Figure 11:
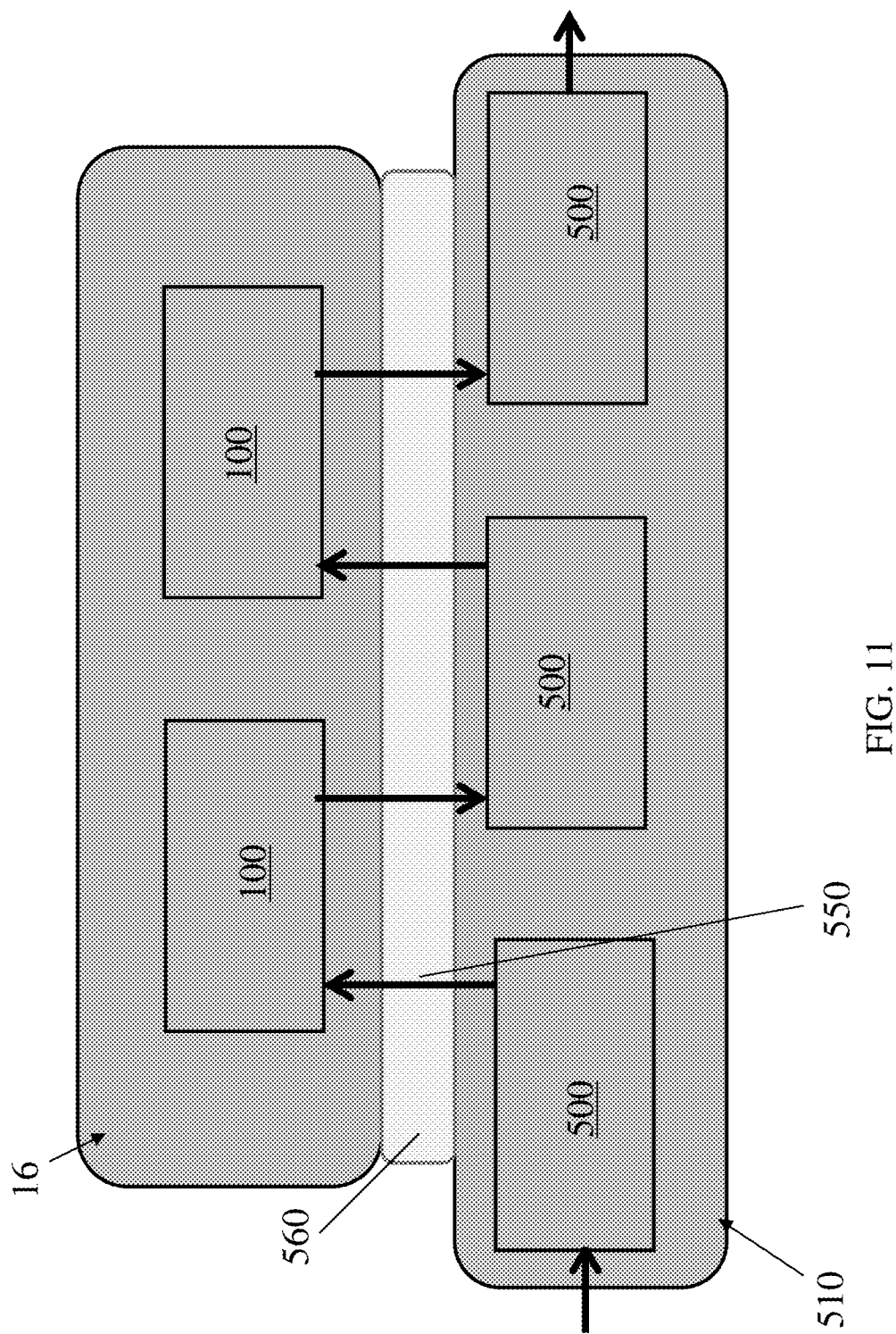
FIG. 11 shows a system level design in accordance with aspects of the present disclosure.

FIG. 11 shows a system level design in accordance with aspects of the present disclosure. More specifically, the system level design includes the passive circuits 100 provided in the redistribution layer 16 and active circuitry 500 in SiGe/SOI layers of chip 510. More specifically, as shown in FIG. 11, the passive circuits 100 can be high performance passive circuits 100 built exclusively in the redistribution layer 16. In embodiments, the high performance passive circuitry 100 can include, e.g., filters, couplers, dividers, combiners, in addition to or as an alternative to the passive circuitry already described herein. The active circuitry 500 can include digital, analog and RF blocks, as examples. For example, the active circuitry can include MOS/NPN transistors built at the front end of line (FEOL) using back end of line (BEOL) in the SOI/SiGe chip 510 for passive circuitry. Also, as shown in FIG. 11, for example, the passive circuits 100 are connected to the active circuits 500 by via interconnects 550 extending through a dielectric material 560 (with the redistribution layer 16 bonded on one side of the dielectric material 560 and the chip 520 bonded on another side of the dielectric material 560).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    passive circuitry comprising plural components each of which are formed in a same wiring level, the plural components comprising a combination of a resistor, an inductor, a transformer, power combiners, filters, couplers, dividers and/or a capacitor;
    interconnects in the same wiring level connecting to one another each of the plural components of the passive circuitry;
    back end of the line components provided on multiple metal layers in insulator material; and
    a magnetic layer of material provided between the passive circuitry and the insulator material with the back end of the line components.

2. The structure of claim 1, wherein the plural components are formed exclusively in a redistribution layer and are devoid of via interconnects.

3. The structure of claim 1, wherein the plural components are pattern transferred on a copper sheet which is a discrete part mounted on a CMOS chip.

4. The structure of claim 1, wherein the plural components comprise the resistor in at least one of a bar shape and serpentine shape.

5. The structure of claim 4, wherein a crystal lattice of the resistor is damaged with an ion beam to increase scattering and reduce mobility and conductivity.

6. The structure of claim 1, wherein the plural components are the resistor and the inductor connected together on the same wiring level, the inductor having a thickness greater than a thickness of the resistor.

7. The structure of claim 1, wherein the inductor is plural inductors with tailored different thicknesses, where a greater thickness is tailored for a lower frequency than a thinner thickness.

8. The structure of claim 7, wherein the capacitor has a tailored thickness greater than a thickness of the inductor.

9. The structure of claim 1, wherein the the capacitor is one or more metal insulator metal capacitors formed as interleaved comb structures in the same wiring level and wherein a width and spacing between fingers of the interleaved comb structures are varied for different frequency bands with a thickness of a wiring being selectively increased resulting in increased side-wall capacitance with the comb structure.

10. The structure of claim 1, wherein the the capacitor is one or more metal insulator metal capacitors formed as interleaved comb structures with a high-k dielectric material selectively placed within the comb structures in the same wiring level.

11. The structure of claim 1, further comprising active circuitry in a front end of line or back end of line layer of a SiGe or SOI chip, wherein the passive circuitry is provided exclusively in a redistribution layer, and the passive circuitry is connected to the active circuitry by via interconnect structures extending through a dielectric material.

12. The structure of claim 1, wherein the plural components include one or more inductors and/or transformers with a high-$\mu$ material selectively placed around the one or more inductors and/or transformers.

13. The structure of claim 1, wherein the plural components include one or more inductors comprised of meandering turns having a total width or length that changes at a constant rate or at a monotonic rate, with a thickness of the meandered turns being varied depending on the frequency band, and a spacing of each consecutive segment of the meandering turns are increased at a constant rate or other monotonic rate with a narrower spacing for low frequency bands and higher spacing for higher frequency bands.

14. A structure comprising:
    a first passive component and its constituent structures composed of a metal wiring and formed exclusively in a single wiring level, the first passive component being surrounded by high-k dielectric material provided on the single wiring level;
    a second passive component and its constituent structures composed of a metal wiring and formed exclusively in the single wiring level, the second passive component being embedded within a high-$\mu$ material, the high-$\mu$ material being a ferromagnetic alloy with properties to enhance inductance density while shielding electronic equipment against static or low frequency magnetic fields; and
    a metal interconnect structure exclusively in the single wiring level and connecting the first passive component to the second passive component thereby forming passive circuitry in the single wiring level.

15. The structure of claim 14, wherein the first passive component and the second passive component are devoid of via interconnects for electrically connecting together their constituent structures and the first passive component being a capacitor and the second passive component being an inductor or transformer.

16. The structure of claim 15, wherein the capacitor is one or more metal insulator metal capacitors formed as interleaved comb structures in the single wiring level with the high-k dielectric material selectively placed about the comb structures.

17. The structure of claim 15, wherein the high-μ material is selectively placed around the inductors and/or transformers in the single wiring level.

18. The structure of claim 15, wherein the inductor is comprised of meandering turns having a total width or length that changes at a constant rate or at a monotonic rate and a spacing of each consecutive segment of the meandering turns is increased at a constant rate or other monotonic rate.

19. The structure of claim 14, wherein the single wiring level is a redistribution layer and further comprising active circuits on a silicon based chip with at least the first passive component connecting to the active circuits by a via interconnects in a dielectric material that is bonded to both the redistribution layer and the silicon based chip.

20. A structure comprising:
  a first high performance passive component composed of a metal wiring and formed exclusively in a single wiring level;
  a second passive component composed of the metal wiring and formed exclusively in the single wiring level and embedded within a selectively placed high-k dielectric material, the second passive component is different from the first high performance passive component;
  a metal interconnect structure exclusively in the single wiring level and connecting the first passive component to the second passive component;
  active circuitry provided in a chip;
  a dielectric material bonded on one side to the single wiring level and bonded on another side to the chip; and
  a via interconnect extending through the dielectric material and connected to the active circuitry of the chip being and to the at least second passive component.

* * * * *